United States Patent
Achari et al.

(10) Patent No.: US 6,729,023 B2
(45) Date of Patent: May 4, 2004

(54) METHOD FOR MAKING A MULTI-LAYER CIRCUIT BOARD ASSEMBLY HAVING AIR BRIDGES SUPPORTED BY POLYMERIC MATERIAL

(75) Inventors: Achyuta Achari, Canton, MI (US); Andrew Zachary Glovatsky, Plymouth, MI (US); Robert Edward Belke, West Bloomfield, MI (US); Brenda Joyce Nation, Troy, MI (US); Delin Li, Canton, MI (US); Lakhi N. Goenka, Ann Arbor, MI (US); Mohan R. Paruchuri, Canton, MI (US); Robert Joseph Gordon, Livonia, MI (US); Thomas Bernd Krautheim, Belleville, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 4 days.

(21) Appl. No.: 09/815,564

(22) Filed: Mar. 23, 2001

(65) Prior Publication Data

US 2001/0035299 A1 Nov. 1, 2001

Related U.S. Application Data

(60) Provisional application No. 60/207,647, filed on May 26, 2000.

(51) Int. Cl.[7] ............................. H05K 3/02; H05K 3/36
(52) U.S. Cl. ............................. 29/847; 29/830; 29/840; 29/846; 174/253; 174/263; 174/266; 216/20; 216/67; 156/252; 430/313; 430/315

(58) Field of Search .................... 29/847, 846, 852, 29/830, 850, 840, 829; 216/17, 20, 67; 156/151, 252; 174/253, 266, 263

(56) References Cited

U.S. PATENT DOCUMENTS

| 3,801,388 | A |   | 4/1974  | Akiyama et al.                |
|-----------|---|---|---------|-------------------------------|
| 4,404,059 | A |   | 9/1983  | Livshits et al.               |
| 4,824,511 | A | * | 4/1989  | Hartman et al. ....... 156/306.6 |
| 5,220,723 | A | * | 6/1993  | Okada ..................... 29/830 |
| 5,268,064 | A | * | 12/1993 | Woo et al. .............. 156/630 |
| 5,558,928 | A | * | 9/1996  | DiStefano et al. ....... 428/209 |
| 5,592,737 | A | * | 1/1997  | Middelman et al. ...... 29/848 |
| 5,738,797 | A |   | 4/1998  | Belke, Jr. et al.             |
| 5,960,538 | A | * | 10/1999 | Kawakita et al. ........ 29/847 |

FOREIGN PATENT DOCUMENTS

JP           2-143588      *   6/1990   ............ 29/830

* cited by examiner

*Primary Examiner*—Peter Vo
*Assistant Examiner*—Minh Trinh
(74) *Attorney, Agent, or Firm*—Law Offices of John Chupa & Assoc, PC; John G. Chupa

(57) ABSTRACT

A method for making a multi-layer circuit board 116 having apertures 96, 98 which may be selectively and electrically isolated from electrically grounded member 46 and further having selectively formed air bridges and/or crossover members 104 which are structurally supported by material 112. Each of the apertures 96, 98 selectively receives electrically conductive material 114.

10 Claims, 8 Drawing Sheets

US 6,729,023 B2

METHOD FOR MAKING A MULTI-LAYER CIRCUIT BOARD ASSEMBLY HAVING AIR BRIDGES SUPPORTED BY POLYMERIC MATERIAL

This application claims the benefit of provisional application Ser. No. 60/207,647 filed May 26, 2000.

FIELD OF THE INVENTION

The present invention relates to a circuit board and a method for making a circuit board and more particularly, to a multi-layer electronic circuit board having metallized apertures which are selectively isolated and/or disconnected from an electrical ground plane and further having selectively formed air bridges and/or crossover circuits.

BACKGROUND OF THE INVENTION

Multi-layer circuit boards operatively receive electronic components and allow the received components to be desirably interconnected and to selectively and cooperatively form electrical circuits. Particularly, these components are operatively received upon opposed board surfaces and within certain interior portions of the board, thereby desirably allowing each of the electronic circuit boards to contain a relatively large amount of components which efficiently, respectively, and densely populate the respective boards.

It is desirable to allow each of the component containing surfaces or portions of a created and/or formed electronic circuit board to communicate and/or to be selectively interconnected, thereby allowing the contained electronic components to cooperatively and selectively form a relatively large number of desired electrical circuits. This desired communication and/or interconnection typically requires the use of shared electrical ground planes, the transmittal of electrical power and/or control type signals between some or all of the component containing surfaces or board portions, and/or the connection of components on each of the opposed surfaces and/or within and between certain of the interior portions and the top and/or bottom and/or other board surfaces.

This desired interconnection typically requires that one or more holes be formed or drilled through each of the circuit boards, thereby creating at least one "through hole" or "via" traversing between each of the opposed component containing surfaces and through the various interior circuit board portions. Typically this drilling process is relatively complex and time consuming, thereby increasing the overall circuit board production cost. This drilling process also undesirably damages and/or destroys many of the circuit boards, thereby further increasing overall production cost.

Further, it is desirable to form "air-bridges" or "crossover type circuits" upon one or more selected surfaces and/or within certain component containing portions of the formed circuit board in order to allow multiple levels of circuits and/or electrical interconnections to be formed upon a single board surface and/or within a certain component containing portion of the circuit board, thereby desirably increasing the amount of electrical circuits which may be created upon and/or within the created circuit board (e.g., increasing the density of the contained electrical circuitry).

These "air bridges" or crossover circuits are typically formed by rather complicated, costly, and time consuming processes. The formed bridges and crossover circuits further do not typically and efficiently accommodate certain desirable circuit board interconnection processes, techniques, and/or methodologies, such as and without limitation, the use of relatively heavy wire bonding (e.g., aluminum wire having a diameter of about five to about twenty milli-meters) or the direct connection of components to a surface of the board.

There is therefore a need to provide an electronic circuit board and a method for producing a multi-layer electronic circuit board which overcomes some or all of the previously delineated drawbacks of prior electronic circuit boards and methods for making a circuit board, which selectively allows grounded and non-grounded "vias" to be desirably and selectively and efficiently formed in a cost effective manner, and which further allows for the efficient and selective formation of air-bridge members or crossover circuits which desirably accommodate diverse types of circuit interconnection processes and which increase the circuitry density within the formed electronic circuit board.

SUMMARY OF THE INVENTION

It is a first object of the present invention to provide an electronic circuit board and a method for producing an electronic circuit board which overcomes some or all of the previously delineated drawbacks of prior electronic circuit boards and of prior electronic circuit board forming methodologies and techniques.

It is a second object of the invention to provide a method for producing a multi-layer electronic circuit board which overcomes some or all of the previously delineated drawbacks of prior multi-layer electronic circuit board forming methodologies and techniques, which allows for the formation or creation of an electronic circuit board which selectively receives various electronic components, which allows for the selective, efficient, and reliable formation of metalized apertures, within the formed and/or created electronic circuit board, which cooperatively allow for communication by and between these various electronic components and which further cooperatively allow for the selective interconnection of these contained components.

It is a third object of the invention to provide a method for producing a multi-layer electronic circuit board which overcomes some or all of the previously delineated drawbacks of prior multi-layer electronic circuit board forming methodologies and techniques and which allows for the selective formation of metallized apertures within a circuit board, which may be selectively connected or disconnected and/or selectively isolated from a formed electrical ground plane or bus.

It is a fourth object of the invention to provide a method for producing a multi-layer electronic circuit board which overcomes some or all of the previously delineated drawbacks of prior multi-layer electronic circuit board forming methodologies and techniques and which allows for the selective and efficient formation of air bridges and/or crossover circuits and/or crossover members which are adapted to accommodate a wide variety of component interconnection assemblies, techniques, and/or methodologies.

According to a first aspect of the invention a circuit assembly is provided comprising an electrically conductive core member having a first surface and a second surface; a first pre-circuit assembly having at least one air-bridge, the pre-circuit assembly operatively disposed upon the first surface of the electrically conductive core member; a second pre-circuit assembly having at least one air-bridge, the second pre-circuit assembly operatively disposed upon the second surface of the core electrically conductive member, thereby forming a circuit assembly having a first aperture which is electrically connected to the core metal member and a second aperture which is electrically isolated from the core metal member.

According to a second aspect of the present invention a circuit assembly is provided. The circuit assembly is made by the process of forming a first pre-circuit assembly including a first core member having a first and a second surface, a first plurality of electrically conductive members disposed upon the first surface, and a second plurality of electrically conductive members disposed upon the second surface; forming a second pre-circuit assembly having first and second circuit boards which are selectively attached to a dielectric adhesive material and which cooperatively form a separation region; coupling the dielectric adhesive material to the second plurality of electrically conductive portions; removing certain portions of the first core member, thereby forming a pedestal portion which abuts the separation region; extending the separation through the pedestal portion, thereby forming a circuit board.

According to a third aspect of the present invention a multi-layer circuit assembly is provided. The circuit assembly is made by the process of providing at least one member having an aluminum core portion which is contained between a top and a bottom layer of copper; providing at least one electrically conductive member having a first and a second surface; providing at least one circuit board; creating an aperture within the at least one electrical conductive member; operatively coupling the at least one circuit board to the first surface of the electrically conductive member; operatively coupling the at least one member to the second surface of the electrically conductive member; and selectively etching the aluminum core portion, thereby forming a circuit assembly.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
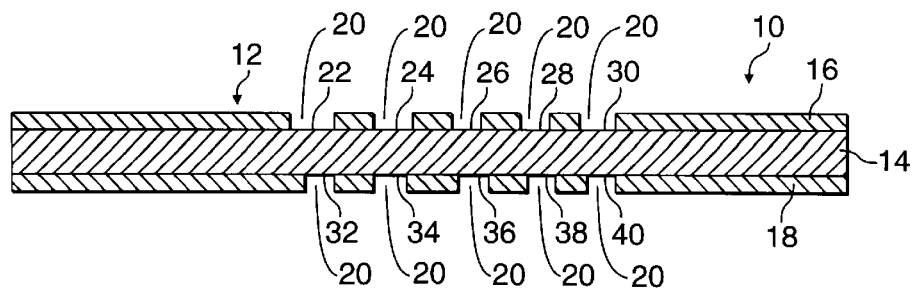
FIGS. 1 (a)–(j) are successive sectional side views of a multi-layer circuit board being produced and/or formed in accordance with the teachings of the preferred embodiment of the invention.

Referring now to FIGS. 1(a)–(j), there is shown a process 10 for making an electronic circuit board assembly in accordance with the teachings of the preferred embodiment of the invention. Particularly, process 10 begins by obtaining and/or providing a member 12 having a first core pardon 14 which is operatively contained between a first or top and a second or bottom layer or a top and a bottom member 16, 18, as best shown in FIG. 1(a). It should be appreciated that the terms "first" and "second" should not he limited to the layer and/or member to which they specifically refer to within this specification (e.g., the term "first" may alternatively refer to the bottom layer or member 18).

In one non-limiting embodiment of the invention, core portion or member 14 comprises conventional and commercially available aluminum material while layers/members 16, 18 comprise conventional, commercially available and substantially identical electrically conductive material, such as copper. As further shown best in FIG. 1(a), layers 16, 18 are notched. That is, certain portions of layers/members 16, 18 are removed by a conventional etching process in order to create selectively formed apertures 20 within the layers 16, 18, thereby creating exposed "areas" or surface portions 22, 24, 26, 28, 30, 32, 34, 36, 38, and 40 of the core member 14. In one non-limiting embodiment of the invention, portions or pairs 22, 32; 24, 34; 26, 36; 28, 38; and 30, 40 are respectively aligned (e.g., portions 32, 34, 36, 38, and 40 are respectively and wholly resident under portions 22, 24, 26, 28, and 30, and portions 32, 34, 36, 38, and 40 are respectively identical in size and shape to portions 22, 24, 26, 28, and 30). In a further non-limiting embodiment of the invention, portions 22, 24, 26, 28, 30, 32, 34, 36, 38, and 40 are each substantially similar in size and shape.

In one non-limiting embodiment of the invention, the thickness of the core member 14 is about fifty to two hundred micrometers while the thickness of portions 16, 18 is substantially identical and is about five to one hundred micrometers. Other sizes, shapes, thicknesses, and/or dimensions of members 14–18 may be utilized.

Figure 1B:
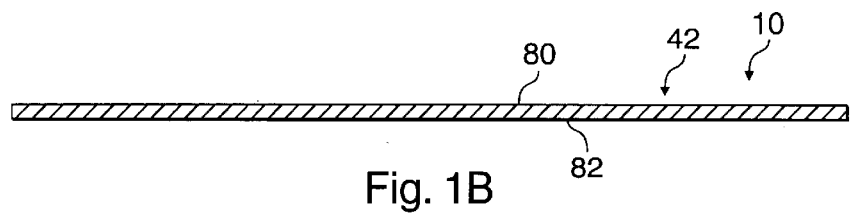
Figure 1C:
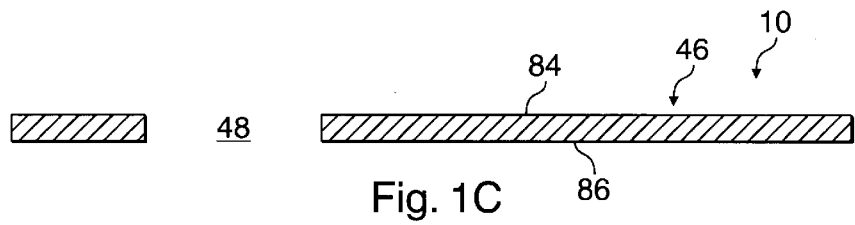
Figure 1D:
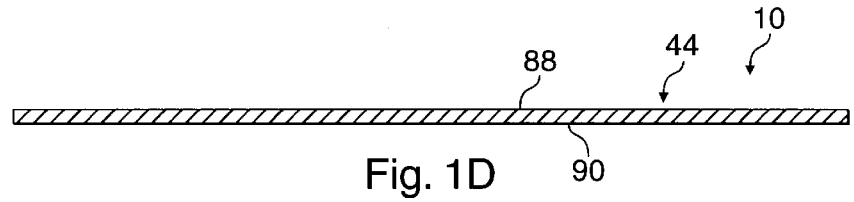

Process 10, as shown best in FIGS. 1(b) and 1(d), further requires the acquisition and/or creation of substantially identical layers or members 42, 44 each of which, in one non-limiting embodiment, comprise substantially identical and commercially available layers of dielectric adhesive material having a substantially identical size, shape, and thickness.

Process 10, as shown best in FIG. 1(c), further requires the acquisition and/or creation of an electrically conductive member or layer 46 which, in one non-limiting embodiment, is formed from conventional copper material having a thickness, in one non-limiting embodiment, ranging from about five micrometers to about two hundred micrometers. Further, at least one aperture or "hole" 48 is created within the member or layer 46 by drilling, punching, and/or etching. As shown later, this at least one aperture 48 will selectively form a "nongrounded" via or "through hole".

Figure 1E:
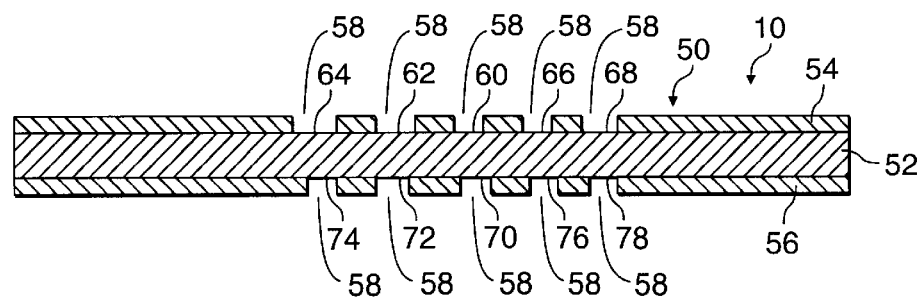

As shown best in FIG. 1(e), process 10 further requires the acquisition and/or creation of a second member 50 which is substantially similar to member 12. More particularly, member 50 includes a core portion or member 52 which is substantially similar to core portion 14, and top or first and bottom or second members or layer portions 54, 56 which are substantially and respectively similar to member/layer portions 16, 18. Layers 54, 56 are each selectively notched and, as such, have several selectively formed apertures 58 which are effective to cause member 50 to have exposed top surface portions 60, 62, 64, 66, 68 and exposed bottom surface portions 70, 72, 74, 76, 78. In one embodiment of the invention, portions or pairs 60, 70; 62, 72; 64, 74; 66, 76; and 68, 78 are aligned (e.g., portions 74, 72, 70, 76, and 78 are respectively and wholly resident under portions 64, 62, 60, 66, and 68 and portions 74, 72, 70, 76, and 78 are respectively identical in size and shape to portions 64, 62, 60, 66, and 68). In a further embodiment of the invention, portions 60, 62, 64, 66, 68, 70, 72, 74, 76, 78 are each substantially similar in size and shape.

Figure 1F:
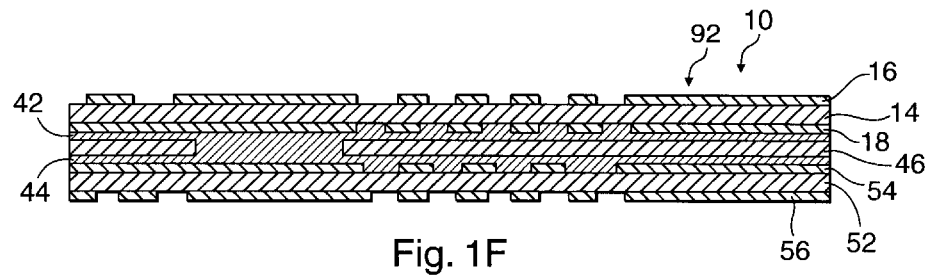

A pre-circuit assembly 92 is formed in the fifth step of the process 10, which is shown best in FIG. 1(f). Particularly, layer 18 of member 12 is attached by a conventional process or method to the top surface 80 of member or layer 42, effective to allow portions of layer 42 to overlay the previously formed apertures 20 within the layer 18, and more particularly, to overlay the exposed portions 32, 34, 36, 38, 40. The bottom surface 82 of member or layer 42 is attached, by a conventional process or method, to the top surface 84 of layer or member 46, thereby overlaying the previously formed aperture 48. The bottom surface 86 of the member 46 is attached, by a conventional process or method, to the top surface 88 of the layer or member 44 and the attached surface 88 overlays the previously formed aperture 48 and causing a portion of the member 42 to fill the aperture 48. Further, the bottom surface 90 of the layer 44 is attached, in a conventional manner, to the top layer 54 of member 50, effective to overlay apertures 58 within layer 54 and to, more particularly, overlay exposed portions 60, 62, 64, 66, and 68. This formed pre-circuit assembly 92 is best shown in FIG. 1(f).

Figure 1G:
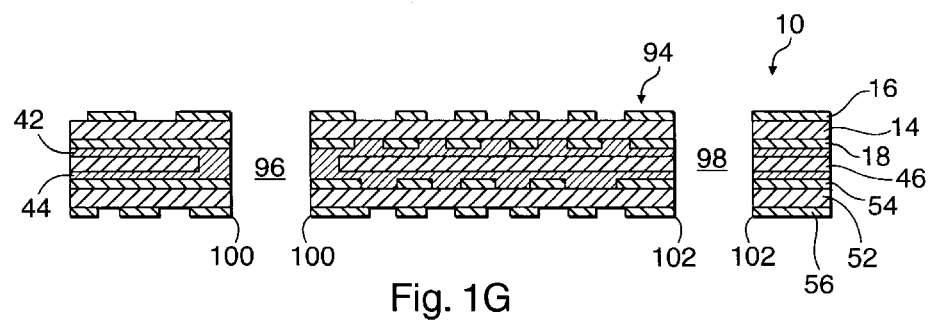

As best shown in FIG. 1(g), process 10 continues with the creation of a pre-circuit assembly 94 which is created by selectively forming first and second apertures 96, 98 within the formed pre-circuit assembly 92. These apertures 96, 98 may be formed by drilling, etching, punching, or by any other conventional process or methodology. Particularly, the first aperture 96 is aligned with (e.g., extends through) the previously created aperture 48 and effectively extends the previously created aperture 48 through the formed pre-circuit assembly 94. The second aperture 98, in one non-limiting embodiment, is substantially identical in shape it and size to the aperture 96 and is aligned with (e.g., extends through) apertures 30, 40. It should be realized that apertures 96, 98 may be of various sizes and shapes and that nothing in this description should or is meant to limit these apertures 96, 98 to any certain size or shape.

Exposed surfaces 100, 102 of pre-circuit assembly 94 are respectively contained within and/or reside within and/or define the apertures 96, 98 and form respective "interior surfaces" of apertures 96, 98. In one non-limiting embodiment of the invention, member 46 functions as or comprises an electrical ground plane (i.e., member 46 is physically and electrically coupled to a source of electrical ground potential). As shown, member 46 does not reside within aperture 96 and does not reside upon surface 100. Hence, surface 100 is electrically isolated and/or electrically disconnected from member 46, thereby causing aperture 96 to be a "non-grounded via" or a "non-grounded aperture". Member 46 does reside within aperture 98 and does reside upon surface 102. Hence, surface 102 is electrically connected to member 46, thereby causing aperture 98 to be a "grounded via" or a "grounded aperture".

Figure 1H:
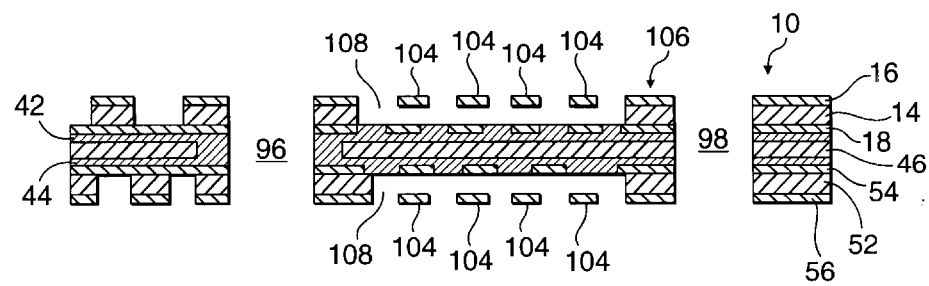
Figure 2:
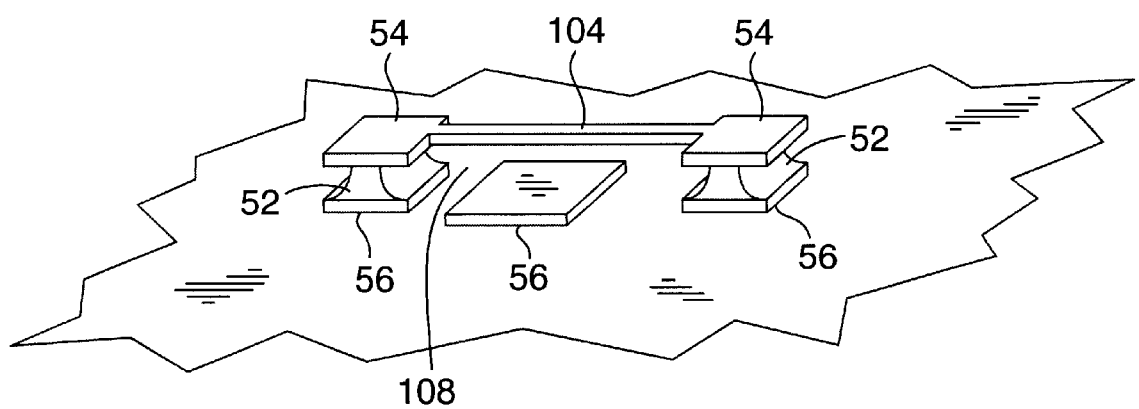
FIG. 2 is a top perspective fragmented view of the multi-layer circuit board shown in FIG. 1(h)

In the seventh step of process 10, as best shown in FIG. 1(h) and FIG. 2, the members 14, 52 are selectively etched forming air-bridges or crossover members 104, thereby creating a multi-layer circuit assembly 106. The formed air-bridge or crossover members 104, in one non-limiting embodiment, cooperatively form voids 108.

Figure 1I:
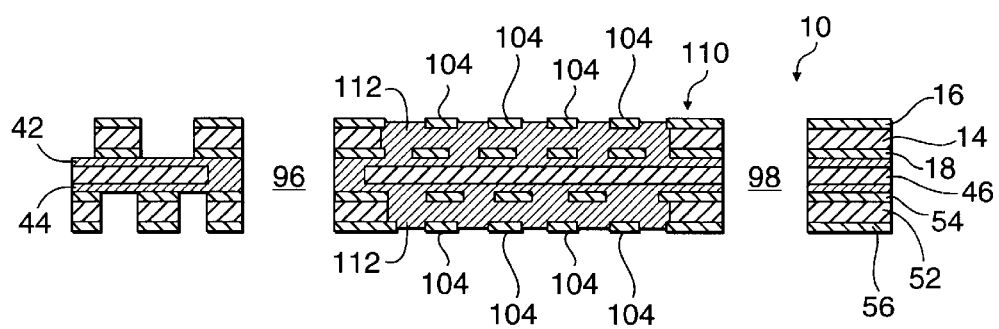

In the eighth step of process 10, which is shown best in FIG. 1(i), a conventional and commercially available polymeric material 112 is applied to pre-circuit assembly 106 to substantially "fill" the cooperatively created voids 108, thereby "underfilling" and structurally supporting the formed air bridges or crossover members 104 and creating a pre-circuit assembly 110.

Figure 1J:
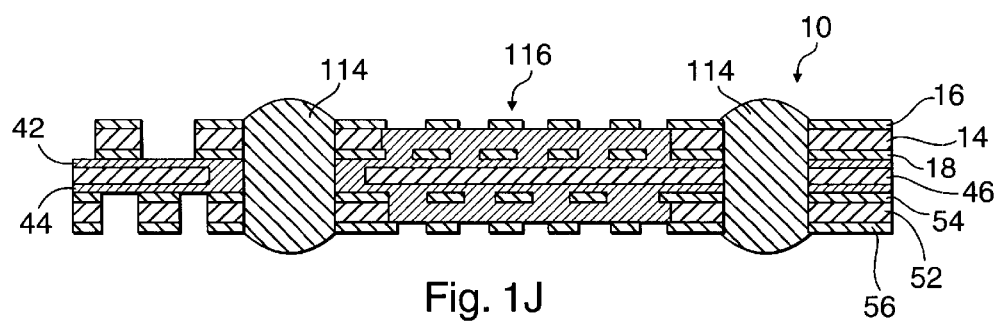

In the ninth step of process 10, which is best shown in FIG. 1(j), an electrically conductive material 114 is applied within and/or through the formed apertures 96, 98. In one non-limiting embodiment, material 114 substantially fills the apertures 96, 98, thereby forming a pre-circuit assembly 116 having portions and/or layers 14, 16, 18, 42, 44, 46, 52, 54, and 56 which are electrically interconnected by the solder material 114. In one non-limiting embodiment of the invention, the electrically conductive material 114 comprises a conventional and commercially available solder material. In a further non-limiting embodiment of the invention, the electrically conductive material 114 comprises a conventional and commercially available conductive adhesive which electrically interconnects the various layers residing within and/or communicated with the apertures 96, 98, thereby allowing the various layers to be electrically interconnected and allowing the board 116 to be functionally tested prior to being populated by components (i.e., the solder 114 allows testing type signals to be readily communicated to these layers). In a further non-limiting embodiment of the invention electrically conductive material 114 is applied by "wave soldering", "reflow soldering", or by "laser soldering". In a further non-limiting embodiment of the invention, electrically conductive material 114 may be applied by "screen printing" the electrically conductive material 114 through apertures 96, 98 and "cured" in a known and conventional manner.

It should be appreciated that the selective etching of core members 14, 52 allows the air bridges and/or crossover members 104 to be efficiently and relatively easily formed in a cost effective manner. Further, such etching allows for the selective formation of air bridges and/or crossover members 104 which may have a selected shape and/or size, thereby allowing the selectively and etchably created air bridges and/or crossover members 104 to support a wide variety of circuits and components, effective to selectively and efficiently accommodate a wide variety of circuit interconnection methodologies and/or techniques.

It should further be appreciated that the apertures 96, 98 may also be efficiently formed and/or created in a "single step" operation which obviates the need to separately drill or create apertures in each member/component which selectively forms the created multi-layer circuit assembly 116.

Referring now to FIGS. 3(a)–(f), there is shown a process 140 for making an electronic circuit board assembly in accordance with the teachings of an alternate embodiment of the invention. Particularly, process 140 begins by obtaining and/or providing a pre-circuit assembly 142 having a core portion or member 144. As shown, several electrically conductive portions or members 146 are contained and/or disposed upon the top or first surface 147 of member 144, and several electrically conductive portions or members 148 are contained and/or disposed upon the bottom or second surface 149 of member 144, as shown best in FIG. 3(a). In one non-limiting embodiment of the invention, core portion 144 comprises conventional and commercially available aluminum material while layers/members 146, 148 comprise conventional, commercially available, and substantially identical electrically conductive material, such as copper. Hence, member 142 comprises, in one non-limiting embodiment, a "copper clad aluminum member".

Figure 3A:
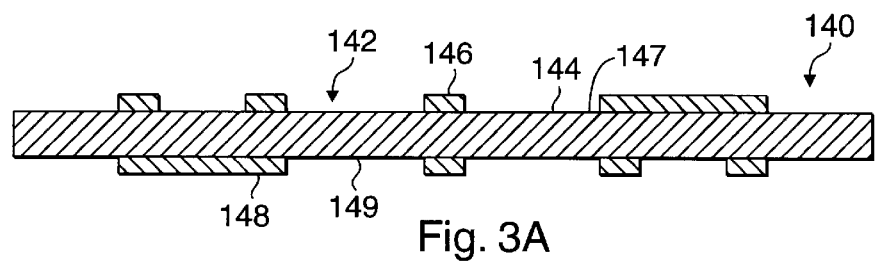
FIGS. 3(a)–(f) are successive sectional side views of a multi-layer circuit board assembly being produced and/or formed in accordance with the teaching of a second embodiment of the invention.
Figure 3B:
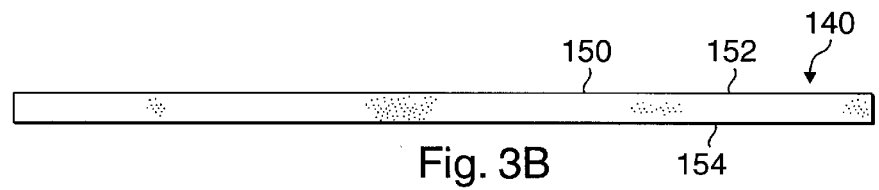

In the second step of process 140, as shown best in FIG. 3(b), a layer of adhesive material 150 is acquired and/or created having a top or first surface 152 and a bottom or second surface 154. Virtually any type of adhesive material may be selectively utilized within this process 140.

Figure 3C:
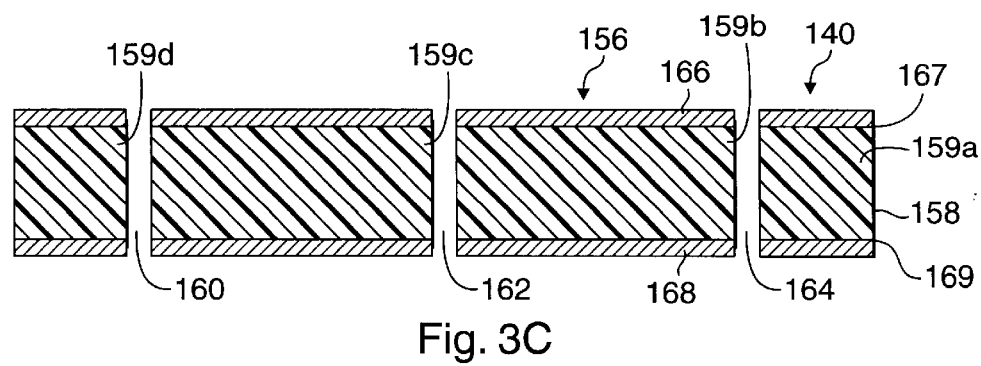

In the third step of process 140, as shown best in FIG. 3(c), a pre-circuit assembly 156 is provided. Particularly, in one non-limiting embodiment of the invention, pre-circuit assembly 156 is comprised of or includes a core portion 158 which contains apertures 160, 162, 164. Particularly, core portion 158 contains a first electrically conductive layer or member 166 which is disposed on top or first surface 167 and a second electrically conductive layer or member 168 which is disposed on bottom or second surface 169. As shown, members 166, 168 each include apertures which are aligned with a unique one of the respective apertures 160, 162, and 164. In one non-limiting embodiment of the invention, core portion 158 comprises conventional and commercially available laminate material while layers/members 166, 168 comprise conventional, commercially available, and substantially identical electrically conductive material, such as copper.

In another non-limiting embodiment of the invention, core portion 158 may be formed from a wide variety of conventional and commercially available circuit boards 159(a)–159(d) such as a conventional "FR-4" or a conventional "rigid circuit board". As shown, boards/portions 159 (a) and 159 (b) are separated by a separation distance, region, or aperture 164; portions 159(c) and 159(b) are separated by a separation distance, region, or aperture 162; and portions 159(d) and 159(a) are separated by a separation distance, region, or aperture 160. It should be appreciated that selective numbers of "pre-formed" and commercially available boards 159(a–d) may be utilized within assembly 140.

Figure 3D:
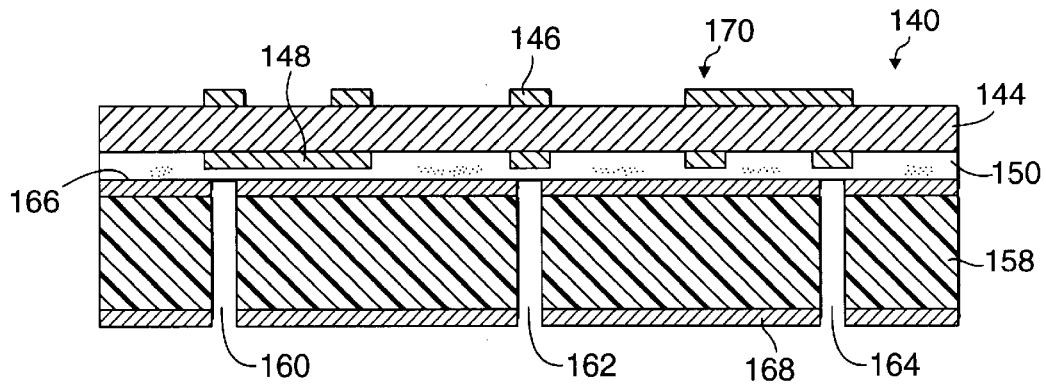

In the fourth step of process 140, as shown best in FIG. 3(d), portions 148 of pre-circuit assembly 142 are attached to the top surface 152 of material 150. Material 166 of pre-circuit assembly 156 is attached to the bottom surface 154 of material 150, thereby forming pre-circuit assembly 170. It should be realized that circuit assembly 156 may be formed/created concurrently with assembly 140, or separately. Moreover, the use of commercially available circuit assemblies 159(a)–159(d) reduces the overall cost of process 140 and allows for the use of the created circuit assemblies in a wide variety of applications. Moreover, separate fabrication and/or creation of assemblies 142 and 156 allows for the separate creation of power traces and allows for a more efficient creation of the final circuit board assembly.

Figure 3E:
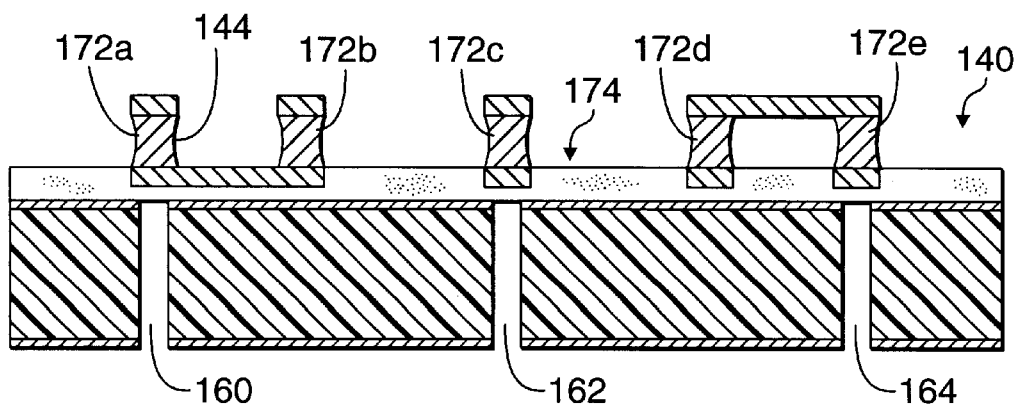

In the fifth step of process 140, as best shown in FIG. 3(e), process 140 continues by applying a certain etchant material (e.g., an aluminum etchant material) to certain selective portions of core portion 144, effective to remove or "etch away" certain selective portions of core portion 144, thereby forming pillar portions 172(a)–(e) of core portion 144 which reside upon the top surface 152 of material 150 and which may selectively overlay apertures 160, 162, 164, thereby forming pre-circuit assembly 174.

Figure 3F:
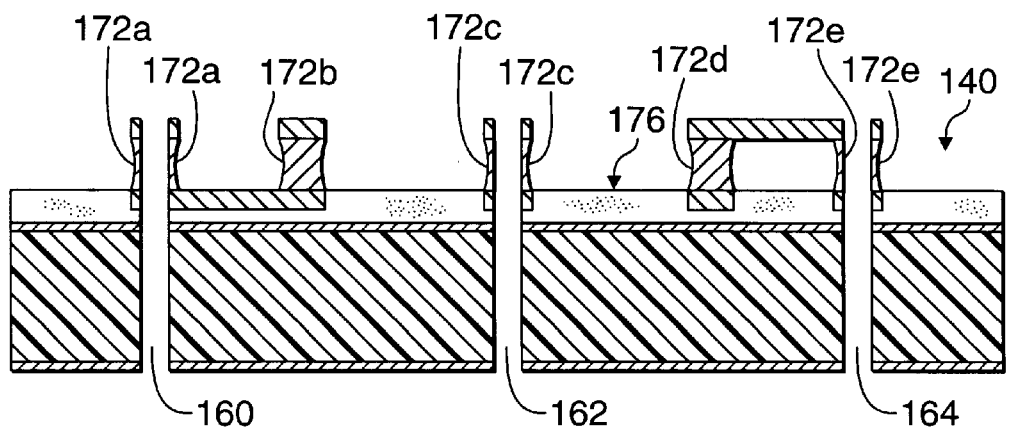

In the sixth step of process 140, as shown best in FIG. 3(f), process 140 continues by drilling or otherwise causing apertures 160, 162, 164 to extend through pre-circuit assembly 174 and through respective pillars 172(a), 172(c), 172(e), thereby forming pre-circuit assembly 176 which may be selectively attached to the formed circuit 116 (e.g., to members 16 or 56) or sued to replace one of the pre-circuit assemblies 12, 50 within process 10. It should be appreciated that apertures 160, 162, 164 may be electroplated or processed in a manner which allows for apertures 160, 162, 164 to form circuit interconnections.

Referring now to FIGS. 4 (a)–(e), there is shown a process 180 for making an electronic circuit board assembly in accordance with the teachings of an alternate embodiment of the invention. Particularly, process 180 begins by obtaining and/or providing a pre-circuit assembly or a member 182 having a core portion 184 which includes electrically conductive portions or members 186 which are disposed upon top or first surface 187, and several electrically conductive portions or members 188 which are disposed upon bottom or second surface 189. In one non-limiting embodiment of the invention, core portion 184 comprises conventional and commercially available aluminum material while layers/members 186, 188 comprise conventional, commercially available, and substantially identical electrically conductive material, such as copper.

Figure 4A:
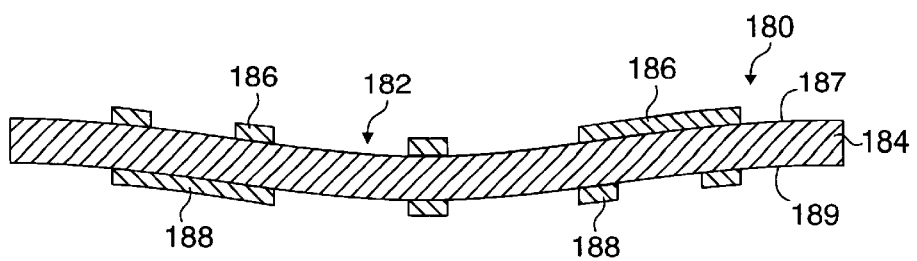
FIGS. 4(a)–(f) are successive sectional side views of a multi-layer circuit board assembly being produced and/or formed in accordance with the teachings of a third embodiment of the invention.
Figure 4B:
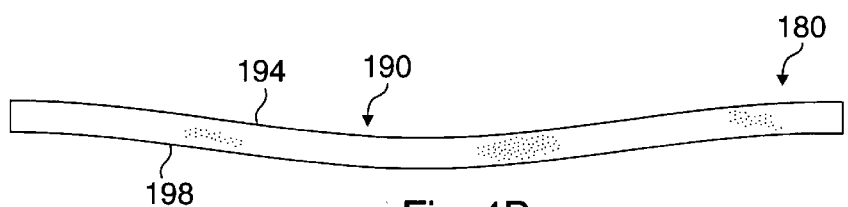
Figure 4C:
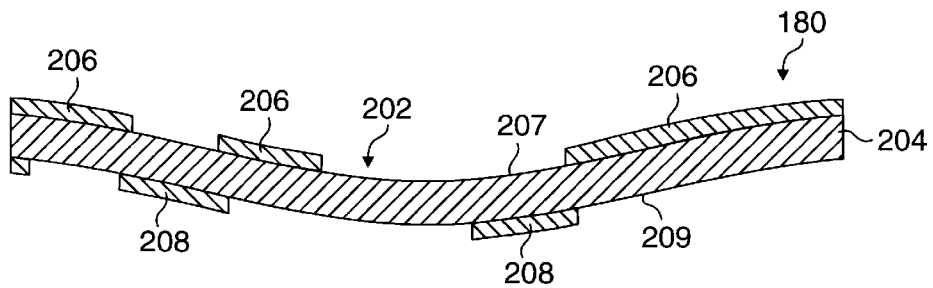
Figure 4D:
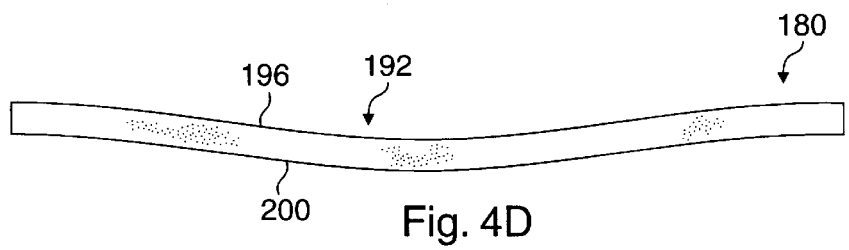

In the second step of process 180, as shown best in FIG. 4(b) and FIG. 4(d), a pair of dielectric adhesive layers or members 190 and 192 are acquired and/or created. These members 190, 192 respectively have top surfaces 194, 196 and bottom surfaces 198, 200.

In the third step of process 180, as shown best in FIG. 4(c), a pre-circuit assembly 202 is provided which is generally and relatively flexible. Particularly, assembly 202 comprises a substantially and relatively flexible core member or portion 204 having several electrically conductive portions or members 206 which are disposed upon the top or first surface 207 and having several electrically conductive portions or members 208 which are selectively disposed upon the second or bottom surface 209.

Figure 4E:
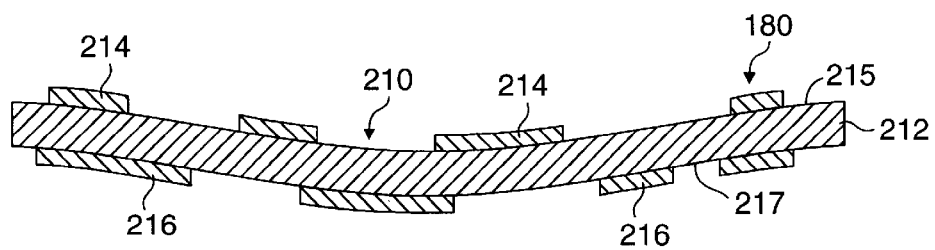

In the fourth step of process 180, as shown best in FIG. 4(e), pre-circuit assembly 210 is provided. Particularly, pre-circuit assembly 210 includes a core member or portion 212 having several electrically conductive portions or members 214 disposed upon a first or top surface 215 and having several electrically conductive portions or members 216 selectively disposed upon a second or bottom surface 217. In one non-limiting embodiment of the invention, core portion 212 comprises conventional and commercially available aluminum material while layers/members 214, 216 each comprise conventional, commercially available, and substantially identical electrically conductive material, such as copper.

Figure 4F:
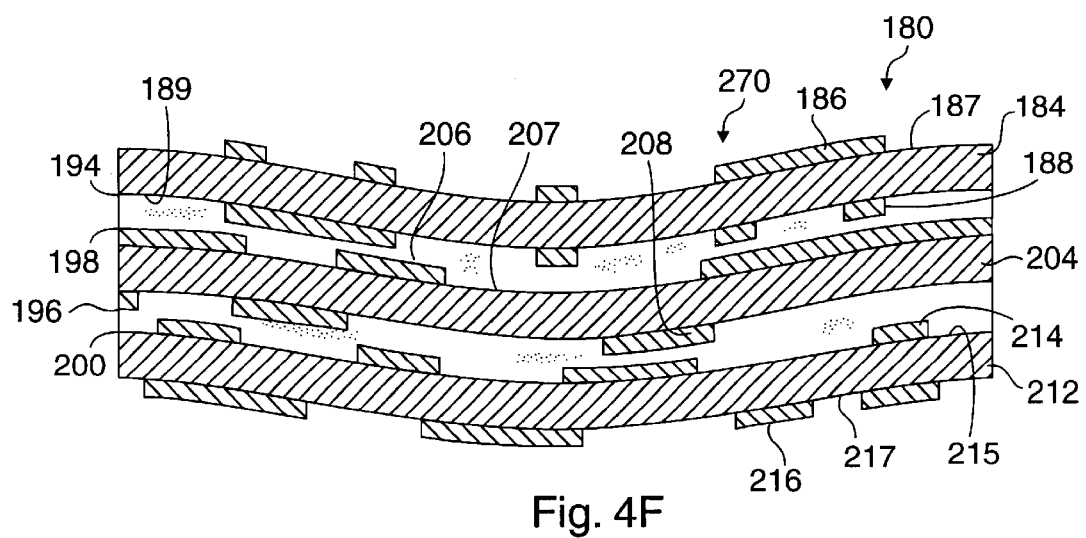

In the fifth step of process 180, as shown best in FIG. 4(f), members 188 of pre-circuit assembly 182 are operatively attached or coupled to the top surface 194 of adhesive 190. Portions 206 of pre-circuit assembly 202 are then operatively connected and/or coupled to the bottom surface 198 of material 190. Portions 208 of pre-circuit assembly 202 are coupled to the top surface 196 of material layer 192. Portions 214 of pre-circuit assembly 210 is operatively connected and/or coupled to the bottom surface 200 of material layer 192, forming a pre-circuit assembly 270 which may be processed by drilling, electroplating, and/or any other process or methodology producing circuit layer interconnections and which may be selectively attached to the formed circuit 116 (e.g., to members 16 or 56) or used to replace one of the pre-circuit assemblies 12, 50 within process 10. It should be appreciated that pre-circuit 270 may be subjected a certain etchant material (e.g., and aluminum etchant material) which "etches away" or removes certain portions of core metal members 184, 212 and which allows the formed pre-circuit assembly to be substantially and relatively flexible.

It should be appreciated that the pre-circuit assemblies formed by processes 140, 180 may be constructed and/or otherwise assembled by the use of multi-layer circuit boards which are formed prior to the use of processes 140, 180 or by attaching multi-layer circuit boards formed concomitantly with process 140, 180. It should further be appreciated that "adhesive" or "non-adhesive" containing circuit boards and/or circuit board assemblies may be alternately and selectively used concomitantly with processes 140, 180. In one non-limiting embodiment of the invention, these circuit boards may be alternately and selectively used to produce circuit interconnections of the "power" type, the "signal" type, the "ground plane" type, or the "interconnection" type.

It should be understood that the invention is not limited to the exact embodiment or construction which has been illustrated and described but that various changes may be made without departing from the spirit and the scope of the invention.

What is claimed is:

1. A method for making a circuit board assembly comprising the steps of:

providing a first member having a first core portion which is contained between a top and a bottom layer;

providing a second member having a second core portion which is contained between a top and a bottom layer;

providing a first layer and a second layer of a first material;

providing an electrically conductive third member;

removing a portion of said top and said bottom layer of said first member, thereby exposing at least two portions of said first core portion of said first member;

removing a portion of said top and said bottom layer of said second member, thereby exposing at least two portions of said second core portion of said second member;

creating a first pre-circuit assembly by attaching the first layer of said first material to a first surface of said third member, attaching the second layer of said first material to a second surface of said third member, attaching said first member to said first layer of said first material, and attaching said second member to said second layer of said first material;

creating a first aperture through said first pre-circuit assembly, thereby causing a portion of said first pre-circuit assembly to be contained within said created aperture;

selectively removing portions of said first and second core portions, thereby creating at least one void and at least one air-bridge;

providing a polymeric material;

applying said polymeric material within said at least one void such that said at least one void is under filled, thereby structurally supporting said at least one air-bridge; and placing an electrically conductive solder material within said aperture and isolating said electrically conductive solder material from said electrically conductive third member, thereby forming a circuit board assembly.

2. The method of claim 1 wherein said third member comprises an electrical ground plane and wherein each electrically conductive portion of said first pre-circuit assembly is electrically isolated from said third member.

3. The method of claim 1 wherein said first material comprises a dielectric adhesive material.

4. The method of claim 1 wherein said first core portion of said first member comprises aluminum and wherein said top and bottom layers of said first member each comprise copper.

5. The method of claim 1 further comprising the step of creating said first aperture within a certain portion of said third member; and extending said first aperture through said first pre-circuit assembly.

6. The method of claim 1 wherein said step of selectively removing portions of said first and second core portions comprises selectively etching said first and second core portions.

7. The method of claim 2 further comprising the steps of creating a second aperture through said first pre-circuit assembly, thereby exposing a second surface of said first pre-circuit assembly within said second aperture; and connecting said second surface of said first pre-circuit assembly to said third member.

8. The method of claim 7 further comprising the step of placing an electrically conductive material within said second aperture.

9. The method of claim 1 further comprising the steps of:

forming a second pre-circuit assembly by providing a fourth member comprising a fourth core portion having a top and a bottom surface which each contain electrically conductive material;

coupling a circuit board to said electrically conductive material residing on said bottom surface; and attaching said electrically conductive material resident upon said top surface to said first pre-circuit assembly.

10. The method of claim 1 further comprising the steps of:

forming a second pre-circuit assembly by providing a first member having a first core portion which is contained between first and second layers of electrically conductive material;

providing a dielectric adhesive material;

coupling said dielectric adhesive material to said second layer of electrically conductive material;

providing a second member having a flexible core portion upon which a portion of said electrically conductive material is disposed;

coupling said electrically conductive material which is disposed upon said flexible core member to said dielectric adhesive material, thereby forming a second pre-circuit assembly; and coupling said second pre-circuit assembly to said first pre-circuit assembly.

\* \* \* \* \*